(12) United States Patent
Liu et al.

(10) Patent No.: US 12,707,910 B2
(45) Date of Patent: Aug. 11, 2026

(54) HARD MASK LAYER AND FORMATION METHOD THEREOF

(71) Applicant: TAIWAN SEMICONDUCTOR MANUFACTURING COMPANY, LTD., Hsinchu (TW)

(72) Inventors: Chih-Cheng Liu, Hsinchu (TW); Wei-Zhong Chen, Taipei City (TW); Chi-Ming Yang, Hsinchu City (TW); Jr-Hung Li, Hsinchu County (TW); Yung-Cheng Lu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 18/481,976

(22) Filed: Oct. 5, 2023

(65) Prior Publication Data

US 2025/0118569 A1 Apr. 10, 2025

(51) Int. Cl.

| | |
|---|---|
| ***C23C 16/505*** | (2006.01) |
| ***C23C 16/26*** | (2006.01) |
| ***C23C 16/56*** | (2006.01) |
| ***H01J 37/32*** | (2006.01) |
| ***H10P 50/00*** | (2026.01) |

(52) U.S. Cl.

CPC .............. *H10P 50/73* (2026.01); *C23C 16/26* (2013.01); *C23C 16/505* (2013.01); *C23C 16/56* (2013.01); *H01J 37/32174* (2013.01); *H01J 37/32449* (2013.01); *H10P 50/691* (2026.01); *H01J 2237/3321* (2013.01)

(58) Field of Classification Search

CPC ....... C23C 16/26; C23C 16/505; C23C 16/56; H01J 37/32174; H01J 37/32449; H01J 2237/3321; H10P 50/73; H10P 50/691; H10P 76/405; H10P 76/4085

See application file for complete search history.

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,012,132 | B2 | 4/2015 | Chang |
| 9,028,915 | B2 | 5/2015 | Chang et al. |
| 9,093,530 | B2 | 7/2015 | Huang et al. |

(Continued)

*Primary Examiner* — Omar F Mojaddedi

(74) *Attorney, Agent, or Firm* — Maschoff Brennan

(57) ABSTRACT

A method includes following steps. A target layer is formed over a substrate. A first hard mask layer is formed over the target layer by a plasma generated using a first radio frequency generator and a second radio frequency generator. The first radio frequency generator and the second radio frequency generator have different powers. A second hard mask layer is formed over the first hard mask layer by a plasma generated using the first radio frequency generator without using the second radio frequency generator. A photoresist layer is formed over the second hard mask layer. The photoresist layer is exposed. The photoresist layer is developed. The first hard mask layer and the second hard mask layer are patterned using the photoresist layer as an etch mask. The target layer is patterned using the first hard mask layer and the second hard mask layer as an etch mask.

20 Claims, 22 Drawing Sheets

(56) References Cited

U.S. PATENT DOCUMENTS

| | | | | |
|---|---|---|---|---|
| 9,146,469 | B2 | 9/2015 | Liu et al. | |
| 9,184,054 | B1 | 11/2015 | Huang et al. | |
| 9,213,234 | B2 | 12/2015 | Chang | |
| 9,223,220 | B2 | 12/2015 | Chang | |
| 9,256,123 | B2 | 2/2016 | Shih et al. | |
| 9,256,133 | B2 | 2/2016 | Chang | |
| 9,529,268 | B2 | 12/2016 | Chang et al. | |
| 9,536,759 | B2 | 1/2017 | Yang et al. | |
| 9,548,303 | B2 | 1/2017 | Lee et al. | |
| 2017/0261850 | A1* | 9/2017 | Stowers | H10P 52/402 |
| 2017/0263505 | A1* | 9/2017 | Wang | H10D 84/038 |
| 2018/0040703 | A1* | 2/2018 | Chang | H10D 30/0243 |
| 2020/0075320 | A1* | 3/2020 | Li | H10D 84/0177 |
| 2020/0312662 | A1* | 10/2020 | Chang | H10P 76/4085 |
| 2025/0308885 | A1* | 10/2025 | Liang | H10P 14/6336 |

* cited by examiner

205c 50a
54a
52a

HARD MASK LAYER AND FORMATION METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
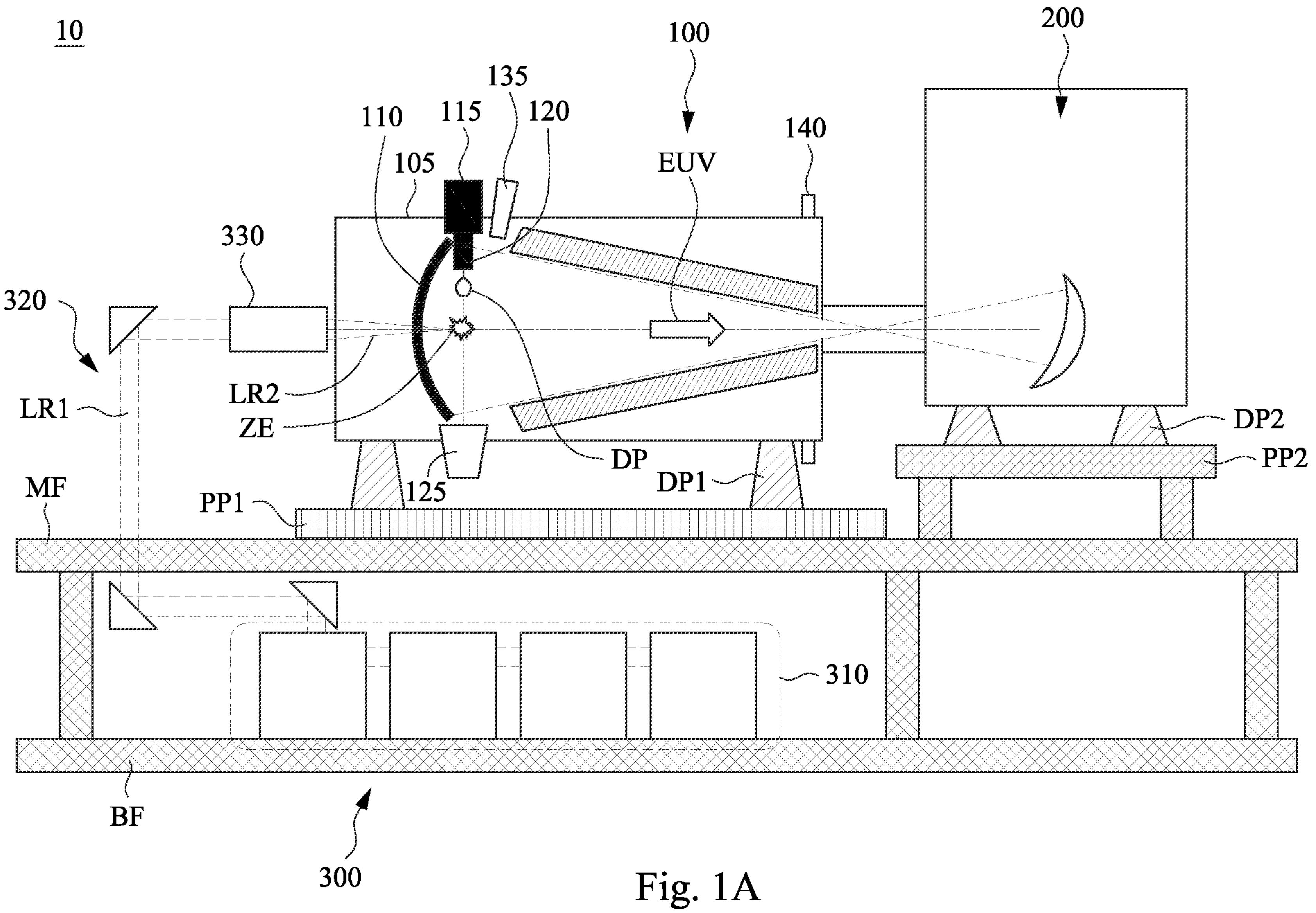
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

A lithography method may be for use in manufacturing a semiconductor device. Photolithography is a process used in micro-fabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist.

Prior to forming the photoresist, a hard mask layer may be formed over a thin film or a substrate to be patterned. The hard mask layer may be used as an etching mask for etching the thin film or the substrate, where a pattern of the hard mask layer is transferred to the thin film or the substrate. The hard mask layer may be formed by a plasma deposition process using, for example, a dual frequency radio frequency (RF) system, to generate plasma. The dual frequency RF system may provide a mixed RF plasma using a high frequency radio frequency (RF) generator and a low frequency radio frequency (RF) generator. The dual frequency RF system can provide independent control of flux and ion energy, since the energy of the ions hitting a film surface influences a film density. The plasma generated by the high frequency radio frequency (RF) generator controls a plasma density and the plasma generated by the low frequency radio frequency (RF) generator controls a kinetic energy of the ions hitting the film surface.

The present disclosure provides a hard mask layer with increased terminal hydroxyl (—OH) groups and/or terminal $CH_3$ groups to facilitate crosslinking of an overlying negative photoresist. Accordingly, a reduced energy dose for extreme ultraviolet (EUV) light can be achieved.

The various aspects of the present disclosure will be discussed below in greater detail with reference to FIGS. 1A-20. First, an EUV lithography system will be discussed below with reference to FIGS. 1A, 1B and 2. Next, the details of the novel hard mask layer and the lithography process employing the hard mask layer will be discussed with reference to FIGS. 3-20.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
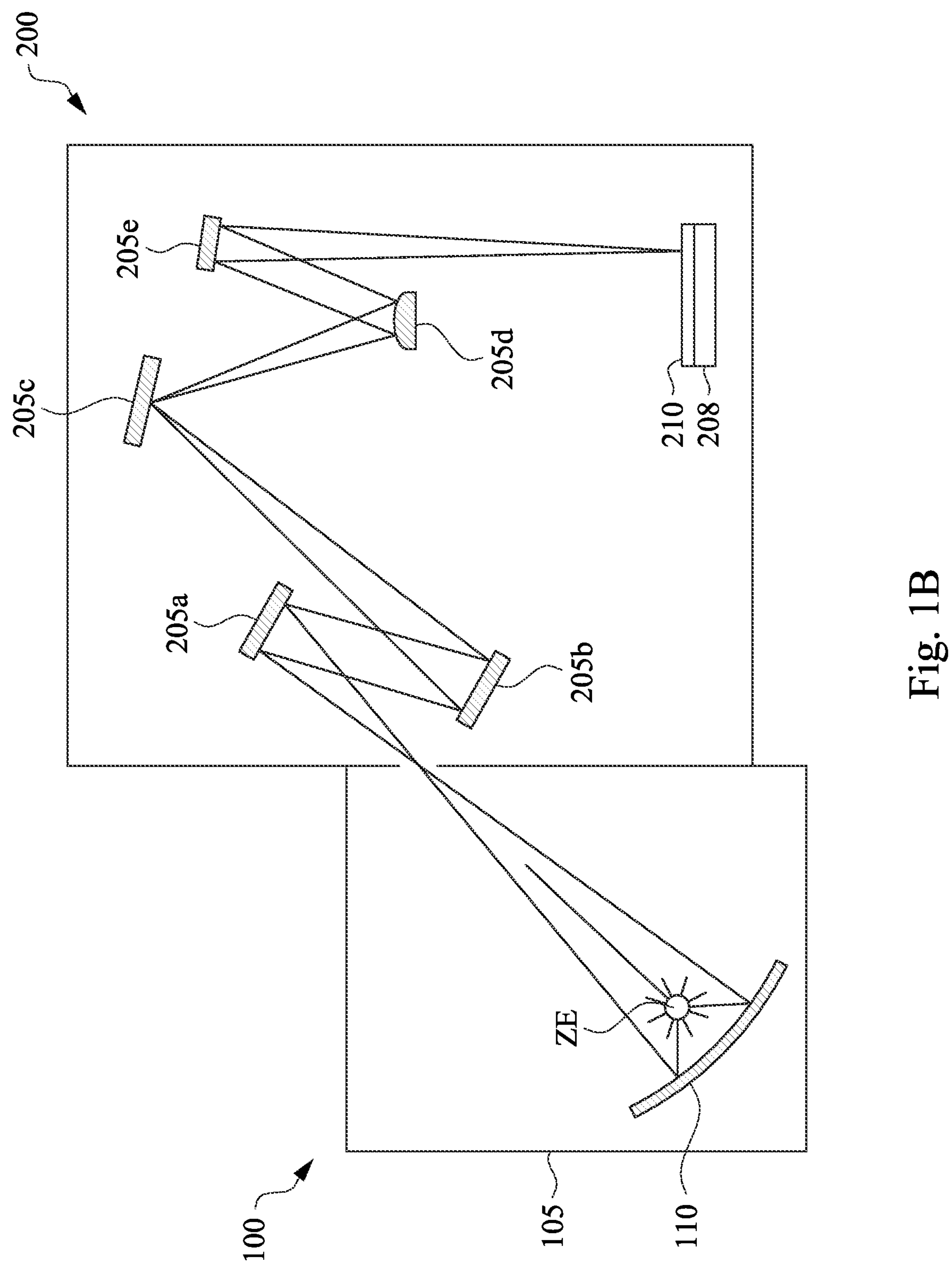
FIG. 1B is a simplified schematic diagram of a detail of an extreme ultraviolet lithography tool according to an embodiment of the disclosure showing the exposure of photoresist coated substrate secured on a substrate stage of the exposure device with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205*c* and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
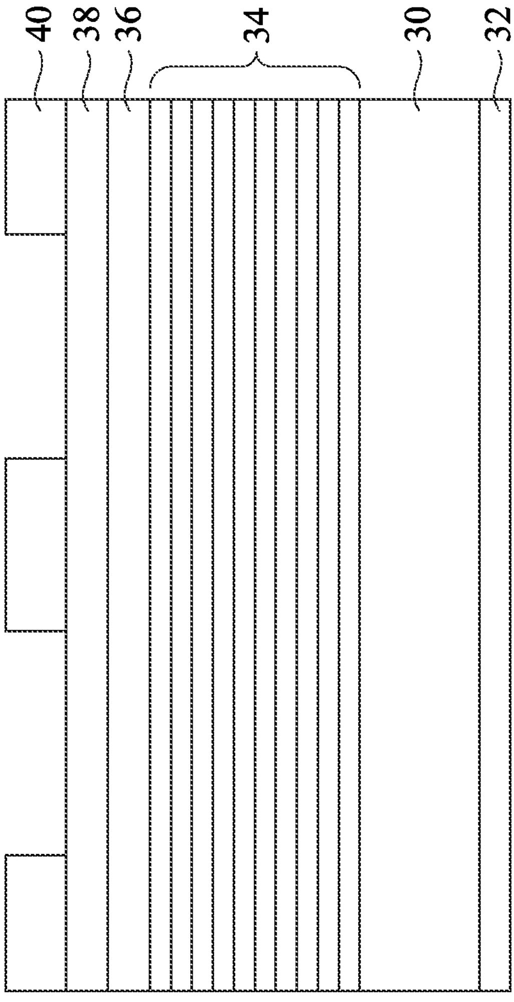
FIG. 2 is cross-sectional view of the reflective mask in accordance with some embodiments.

FIG. 2 is a cross-sectional view of the reflective mask 205*c* in accordance with some embodiments. The reflective mask 205*c* in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205*c* includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205*c* also includes a capping layer 36 disposed over the ML structure 34 to prevent oxidation of the ML. The EUV mask 205*c* may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205*c* also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3, 4A, 6A, 7-12 are cross-sectional views of intermediate stages in formation of features in a target layer 54 on a substrate 52 of a semiconductor device 50, in accordance with some embodiments. The target layer 54 is a layer in which a plurality of patterns is to be formed. In some embodiments, the semiconductor device 50 may be processed as part of a larger wafer. In such embodiments, after various features of the semiconductor device 50 are formed (e.g., active devices, interconnect structures, and the like), a singulation process may be applied to scribe line regions of the wafer in order to separate individual semiconductor dies from the wafer (also referred to as singulation).

In some embodiments, the target layer 54 is a multi-layer film stack. The substrate 52 may be formed of a semiconductor material such as silicon, doped or un-doped, or an active layer of a semiconductor-on-insulator (SOI) substrate. The substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like. Other substrates, such as multi-layered or gradient substrates, may also be used. Devices, such as transistors, diodes, capacitors, resistors, and the like, may be formed in and/or on an active surface of the substrate 52. In some embodiments, the target layer 54 may be a semiconductor substrate. For example, in some embodiments, the target layer 54 may be a semiconductor substrate used to form fin field-effect transistors (FinFETs), nanostructure field effect transistors (nano-FETs), or the like. In such embodiments, the substrate 52 may be omitted.

The target layer 54 may be a layer in which a pattern is to be formed. In some embodiments, the target layer 54 may be a conductive layer, a dielectric layer, a semiconductor layer, or the like. In embodiments in which the target layer 54 is a conductive layer, the target layer 54 may be a metal layer, a polysilicon layer, or the like. The target layer 54 may be deposited by physical vapor deposition (PVD), chemical vapor deposition (CVD) (e.g., blanket deposition or the like), or the like. The conductive layer may be patterned according to the processes described below to form metal gates (e.g., in a cut metal gate process), conductive lines, conductive vias, dummy gates (e.g. for replacement gates in FinFETs, nano-FETs, or the like), or the like.

In embodiments in which the target layer 54 is a dielectric layer, the target layer 54 may be an inter-metal dielectric layer, an inter-layer dielectric layer, a passivation layer, or the like. The target layer 54 may be a material having a low dielectric constant (e.g., a low-k material). For example, the target layer 54 may have a dielectric constant lower than 3.8, lower than 3.0, or lower than 2.5. The target layer 54 may be a material having a high dielectric constant, such as a dielectric constant higher than 3.8. The target layer 54 may be deposited by CVD, atomic layer deposition (ALD), or the like. One or more openings (such as openings 55, discussed below with respect to FIG. 12) may be patterned in the target layer 54 according to the processes described below and conductive lines, conductive vias, or the like may be formed in the openings in the target layer 54.

In embodiments in which the target layer 54 is a semiconductor material, the target layer 54 may be formed of silicon, silicon germanium, or the like. In some embodiments, the target layer 54 may be formed of a crystalline semiconductor material such as crystalline silicon, crystalline silicon carbide, crystalline silicon germanium, a crystalline III-V compound, or the like. In some embodiments, openings (such as openings 55, discussed below with respect to FIG. 12) may be patterned in the target layer 54 according to the processes described below and shallow trench isolation (STI) regions may be formed in the openings in the target layer 54. Semiconductor fins may protrude from between neighboring STI regions and source/drain regions may be formed in the semiconductor fins. The semiconductor fins may include material of the target layer 54 remaining after forming the openings in the target layer 54. Gate dielectric layers and gate electrodes may be formed over channel regions in the semiconductor fins, thereby forming semiconductor devices such as FinFETs, nano-FETs, or the like.

Figure 3:
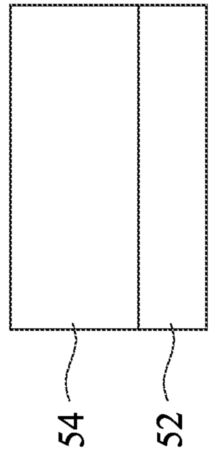
Figure 3:

Although FIG. 3 illustrates the target layer 54 as being in physical contact with the substrate 52, any number of intervening layers may be disposed between the target layer 54 and the substrate 52. Such intervening layers may include an inter-layer dielectric (ILD) layer, which may include a low-k dielectric and may include contact plugs formed therein; other inter-metallic dielectric (IMD) layers having conductive lines and/or vias formed therein; one or more intermediary layers (e.g., etch stop layers, adhesion layers, or the like); combinations thereof; or the like. In some embodiments, an etch stop layer may be disposed directly under the target layer 54. The etch stop layer may act as a stop for an etching process subsequently performed on the target layer 54 (e.g., the etching process described below with respect to FIG. 12). The materials and processes used to form the etch stop layer may depend on the material of the target layer 54. In some embodiments, the etch stop layer may be formed of silicon nitride, SiON, SiCON, SiC, SiOC, $SiC_xN_y$, $SiO_x$, other dielectrics, combinations thereof, or the like. The etch stop layer may be deposited by CVD, ALD, plasma-enhanced chemical vapor deposition (PECVD), low-pressure CVD (LPCVD), PVD, or the like.

Figure 4A:
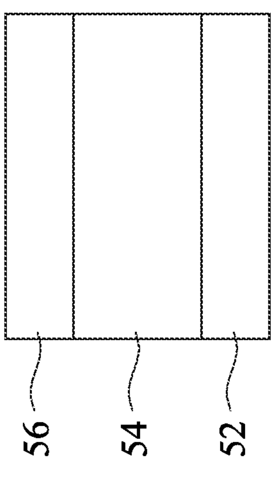
FIGS. 3 and 4A are cross-sectional views of intermediate stages in formation of features in a target layer on a substrate of a semiconductor device, in accordance with some embodiments.
Figure 4A:

Reference is made to FIG. 4A. In some embodiments, a first hard mask layer 56 is formed on the target layer 54. A material of the first hard mask layer 56 may be determined to provide a high etch selectivity with an underlying layer, for example, with respect to the target layer 54. The first hard mask layer 56 may be deposited by a plasma deposition method. In some embodiments, the first hard mask layer 56 is a carbon-based material such as amorphous carbons. That is, the first hard mask layer 56 is an amorphous carbon (a-C) layer. The first hard mask layer 56 may be deposited by any suitable deposition techniques such as CVD, PECVD or the like. In some embodiments, deposition of the first hard mask layer 56 is performed in a PECVD apparatus.

Figure 5:
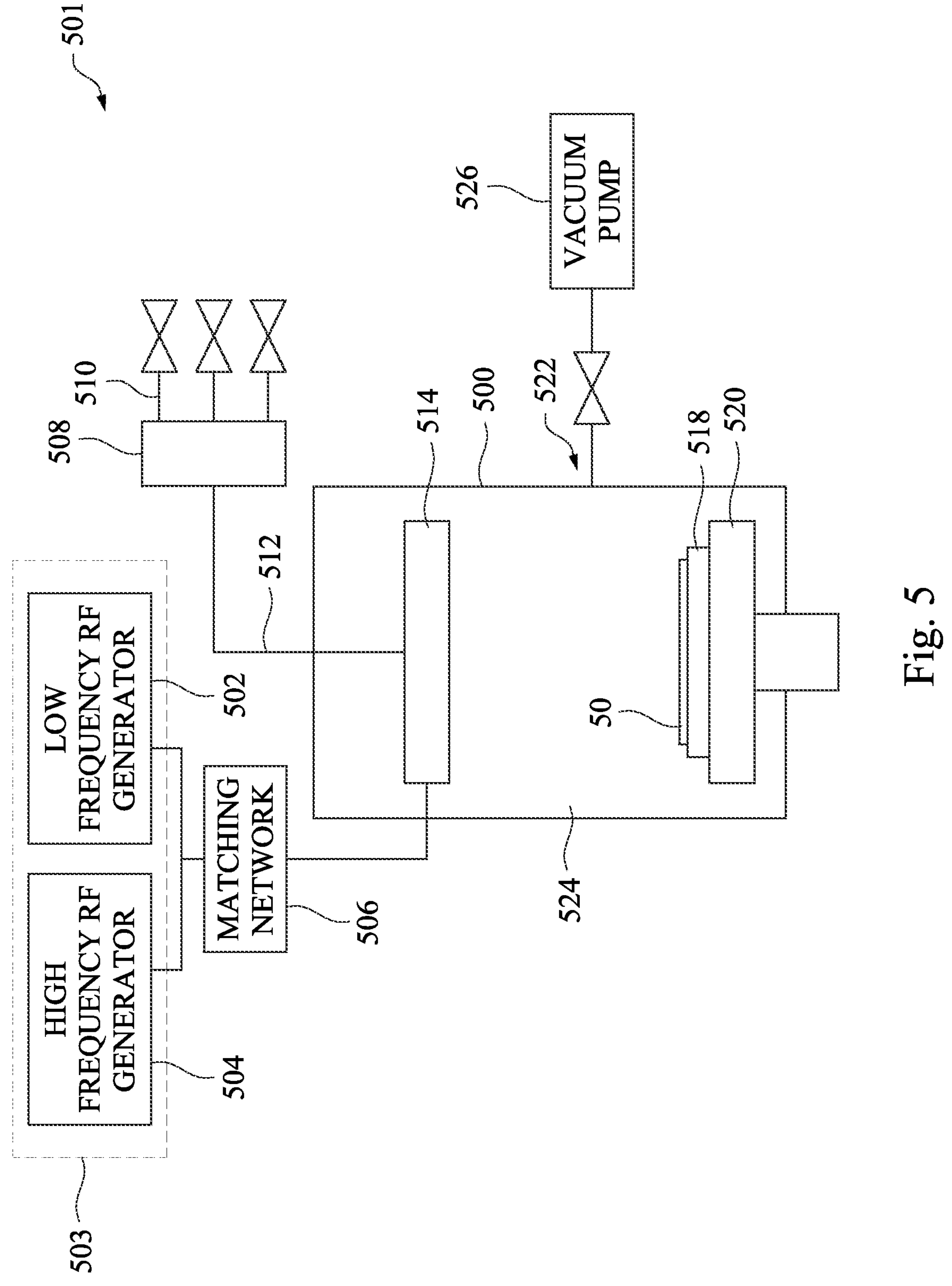
FIG. 5 shows a schematic depiction of a PECVD apparatus in accordance with some embodiments.

FIG. 5 shows a schematic depiction of a PECVD apparatus 501 in accordance with some embodiments. As shown, a reactor 500 includes a process chamber 524, which encloses other components of the reactor 500 and serves to contain the plasma generated by a capacitor type system including a showerhead 514 working in conjunction with a grounded heater block 520. Reference is made to FIGS. 4A and 5. A dual frequency plasma system 503 is included in the reactor 500. For example, the dual frequency plasma system 503 includes a high frequency RF generator 504 and a low frequency RF generator 502 connected to a showerhead 514 through a matching network 506. The power and frequency supplied by the matching network 506 is sufficient to generate a plasma from a process gas. The high frequency RF generator 504 is configured to provide high frequency plasma source, and the low frequency RF generator 502 is configured to provide low frequency plasma source. For example, in deposition process, the high frequency RF generator 504 generates a high frequency power with a frequency in a range from about 2 MHz to about 60 MHz, such as about 13.56 MHz. In a deposition process, the low frequency power is in a range from about 100 kHz to 2 MHz.

Figure 4B:
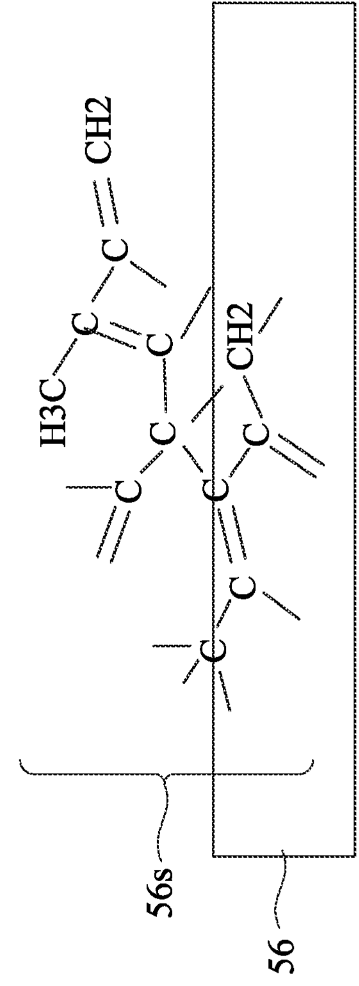
FIG. 4B is an enlarged schematic diagram of a top surface of the first hard mask layer in accordance with some embodiments.

The dual frequency plasma system 503 generates the plasma, providing independent control of flux and ion energy, since the energy of the ions hitting a film surface influences a film density. The high frequency plasma controls plasma density and the low frequency plasma controls kinetic energy of the ions hitting the film surface. In some embodiments, the first hard mask layer 56 is formed by a plasma deposition by generating a plasma in the process chamber 524 using the high frequency RF generator 504 and the low frequency RF generator 502 such that the first hard mask layer 56 can have terminal carbon-carbon double bonds. For example, the first hard mask layer 56 is formed by a plasma generated using a first radio frequency generator (e.g., the high frequency RF generator 504) and a second radio frequency generator (e.g., the low frequency RF generator 502) in which the first radio frequency generator and the second radio frequency generator have different powers. In certain embodiments, the power of the first radio frequency generator (e.g., the high frequency RF generator 504) is higher than the power of the second radio frequency generator (e.g., the low frequency RF generator 502). FIG. 4B is an enlarged schematic diagram of a top surface of the first hard mask layer 56 in accordance with some embodiments. For example, the first hard mask layer 56 has a top surface 56*s* with terminal carbon-carbon double bonds. In some embodiments, the first hard mask layer 56 is deposited using a dual frequency RF, a process temperature may be in a range from about 340° C. to about 360° C., such as about 350° C., and the first hard mask layer 56 can have a high film stress, a high density or a high hardness.

Within the reactor 500, a wafer pedestal 518 supports the semiconductor device 50. The pedestal typically includes a chuck, a fork, or lift pins to hold and transfer the semiconductor device 50 during and between the depositions. The chuck may be an electrostatic chuck, a mechanical chuck or various other types of chuck as are available for use in the industry and/or research. The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit the process chamber 524 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve. In certain embodiments, a system controller (not shown) is associated with the apparatus and is employed to control process conditions during deposition of the films, insert and remove wafers, etc. The controller will include one or more memory devices and one or more processors. The processor may include a CPU or computer, analog and/or digital input/output connections, stepper motor controller boards, etc.

In certain embodiments, the controller controls all of the activities of the PECVD apparatus 501. The system controller executes system control software including sets of program instructions for controlling the timing, mixture of gases, chamber pressure, chamber temperature, wafer temperature, RF power levels, wafer chuck or susceptor position, and other parameters of a particular process. For example, instructions specifying flow rates of carbon-containing precursor, argon, and helium for carbon or carbon film deposition may be included. In general, instructions may include instructions for process conditions for any of the processes described herein. The controller may include different or identical instructions for different apparatus stations, thus allowing the apparatus stations to operate either independently or synchronously. Other computer programs stored on memory devices associated with the controller may be employed in some embodiments.

A user interface may be associated with controller. The user interface may include a display screen, graphical software displays of the apparatus and/or process conditions, and user input devices such as pointing devices, keyboards, touch screens, microphones, etc. The computer program code for controlling the deposition processes can be written in any conventional computer readable programming language. The controller parameters relate to process conditions such as, for example, process gas composition and flow rates, temperature, pressure, plasma conditions such as RF power levels and the low frequency RF frequency, etc. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus. The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. A plasma control program may include code for setting RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In some embodiments, the first hard mask layer 56 may be deposited by flowing a hydrocarbon-containing source such as a gas-phase hydrocarbon or a liquid-phase hydrocarbon, and a plasma-initiating gas that has been entrained the process chamber 524 in a carrier gas. The hydrocarbon source may be a mixture of one or more hydrocarbon compounds. Hydrocarbon compounds or derivatives thereof that may be included in the hydrocarbon source may be described by the formula $C_xH_y$, where x has a range of between 1 and 10 and y has a range of between 2 and 30. Suitable hydrocarbon compounds may include, but are not limited to, acetylene ($C_2H_2$), ethane ($C_2H_6$), propylene ($C_3H_6$), propyne ($C_3H_4$), propane ($C_3H_8$), butane ($C_4H_{10}$), butylene ($C_4H_8$), butyne ($C_4H_6$), vinylacetylene, phenylacetylene ($C_8H_6$), benzene, styrene, toluene, xylene, ethylbenzene, acetophenone, methyl benzoate, phenyl acetate, phenol, cresol, furan, alpha-terpinene, cymene, 1,1,3,3-tetramethylbutylbenzene, t-butylether, t-butylethylene, methyl-methacrylate, and t-butylfurfurylether, compounds having the formula $C_3H_2$ and $C_5H_4$, monofluorobenzene, difluorobenzenes, tetrafluorobenzenes, hexafluorobenzene, and the like.

In certain embodiments, the deposition of the first hard mask layer 56 may include the use of the plasma-initiating gas that is introduced into the process chamber 524 at before and/or same time as the hydrocarbon compound and a plasma is initiated to begin deposition. The plasma-initiating gas may be a high ionization potential gas including, but is not limited to, helium gas, hydrogen gas, nitrogen gas, argon gas, or a combination thereof.

Figure 6B:
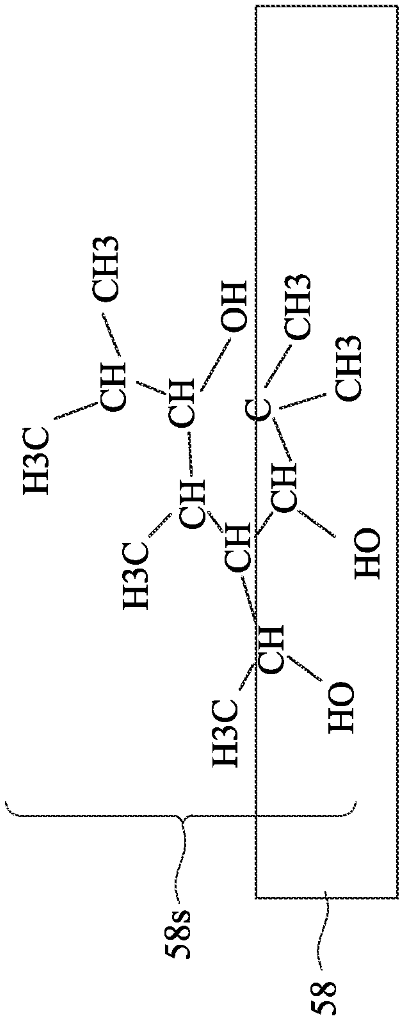
FIG. 6B is an enlarged schematic diagram of a top surface of the second hard mask layer in accordance with some embodiments.
Figure 6A:
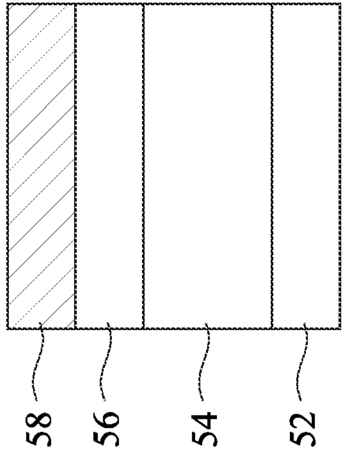
FIG. 6A is a cross-sectional view of intermediate stages in formation of features in a target layer on a substrate of a semiconductor device, in accordance with some embodiments.

Reference is made to FIG. 6A. In some embodiments, a second hard mask layer 58 is formed on the first hard mask layer 56 by using the PECVD apparatus 501 of FIG. 5. That is, the second hard mask layer 58 may be deposited by a plasma deposition method. In some embodiments, the second hard mask layer 58 is a carbon-based material such as amorphous carbons. That is, the second hard mask layer 58 is an amorphous carbon (a-C) layer. In some embodiments, the second hard mask layer 58 is formed by a plasma deposition by a plasma generated using a first radio frequency generator (e.g., the high frequency RF generator 504) without using a second radio frequency generator (e.g., the low frequency RF generator 502). In other words, during depositing the second hard mask layer 58, the high frequency RF generator 504 is turned on while the low frequency RF generator 502 is turned off. In other words, the plasma deposition to form the second hard mask layer 58 is performed by generating the plasma in the process chamber 524 using the high frequency RF generator 504. Therefore, the second hard mask layer 58 can have increased terminal hydroxyl (—OH) groups and/or terminal $CH_3$ groups, which facilitate crosslinking of a subsequently formed overlying photoresist layer (see FIG. 7). The second hard mask layer 58 can have reduced terminal carbon-carbon double bonds. FIG. 6B is an enlarged schematic diagram of a top surface of the second hard mask layer 58 in accordance with some embodiments. For example, the second hard mask layer 58 has a top surface 58*s* with terminal hydroxyl (—OH) groups and/or terminal $CH_3$ groups. That is, the second hard mask layer 58 has an amount of terminal $CH_3$ groups being more than an amount of terminal $CH_3$ groups of the first hard mask layer 56 in some embodiments. In other words, the second hard mask layer 58 and the first hard mask layer 56 have different amounts of terminal $CH_3$ groups. In some embodiments, the second hard mask layer 58 has an amount of terminal carbon-carbon double bonds being less than an amount of terminal carbon-carbon double bonds of the first hard mask layer 56. Accordingly, a reduced energy dose for extreme ultraviolet (EUV) light can be achieved. Due to depositing the second hard mask layer 58 by generating a plasma in the process chamber 524 using a single frequency radio frequency generator, such as the high frequency radio frequency generator 504, the deposition temperature of the second hard mask layer 58 can be reduced to maintain a quality and dangling bonds of the underlying first hard mask layer 56. That is, the second hard mask layer 58 is formed at a temperature lower than a formation temperature of the first hard mask layer 56 in some embodiments.

In some embodiments, a post-treatment is performed to the as-deposited second hard mask layer 58 to increase an amount of terminal hydroxyl (—OH) groups of the second hard mask layer 58. For example, the post-treatment is performed using an oxygen-containing chemical including ozone gas, hydrogen peroxide ($H_2O_2$), $H_2O$ rinse, the like, or a combination thereof.

Figure 7:
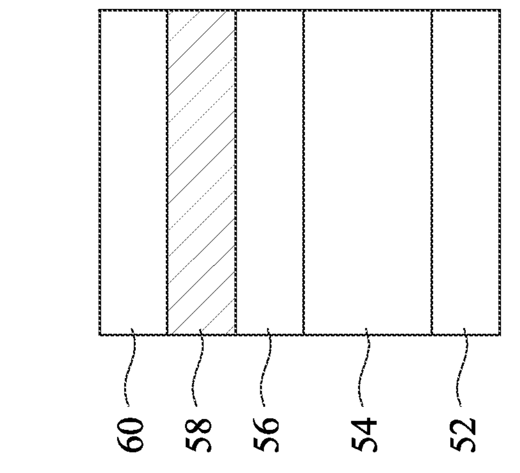
FIGS. 7-12 are cross-sectional views of intermediate stages in formation of features in a target layer on a substrate of a semiconductor device, in accordance with some embodiments.

Reference is made to FIG. 7. In some embodiments, a photoresist layer 60 is formed on the second hard mask layer 58. For example, a photoresist composition is deposited on the second hard mask layer 58 to form the photoresist layer 60. In some embodiments, the photoresist layer 60 is in contact with the second hard mask layer 58. In some embodiments, the photoresist composition may include a metallic photoresist being a negative photoresist. In some embodiments, the photoresist composition may include a surfactant, chromophore, or the like. The metallic photoresist may be a metal complex including a metallic core and at least one ligand bonded to the metallic core. In some embodiments, the metallic core is a metal oxide, such as an oxide of Cs, Ba, La, Ce, In, Sn, Ag, and Sb. For example, the negative tone metallic photoresist includes at least one of metal complexes with several ligands and counter ions. The ligands can dissociate after an exposure and further complexation or condensation may happen via oxygen treatment using such as $H_2O$, $O_2$, or a combination thereof.

Figure 8:
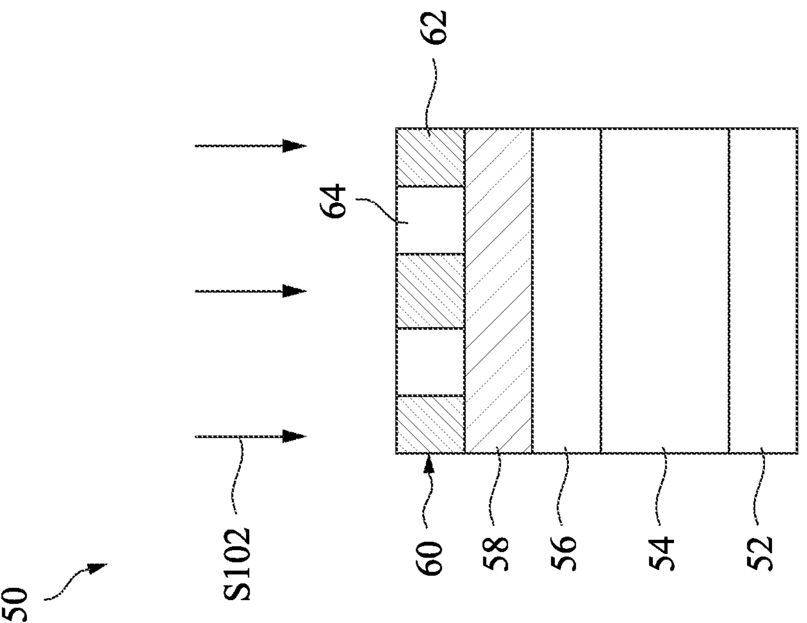

Reference is made to FIG. 8. After forming the photoresist layer 60, the photoresist layer 60 is exposed to an actinic radiation S102. For example, the photoresist layer 60 has an exposed region 62 and an unexposed region 64. In some embodiments, the photoresist layer 60 is exposed to the actinic radiation S102 having a wavelength being substantially less than about 250 nm which comprises KrF, ArF, EUV, E-beam, or a combination thereof. The increased amount of terminal $CH_3$ groups of the second hard mask layer 58 enhances cutting of the metallic core and the ligands bonded to the metallic core. For example, during the actinic radiation S102, hydrogen radicals (H*) can be produced from the terminal $CH_3$ groups of the second hard mask layer 58, promoting cutting of the bonding of metallic core and the ligands.

Figure 9:
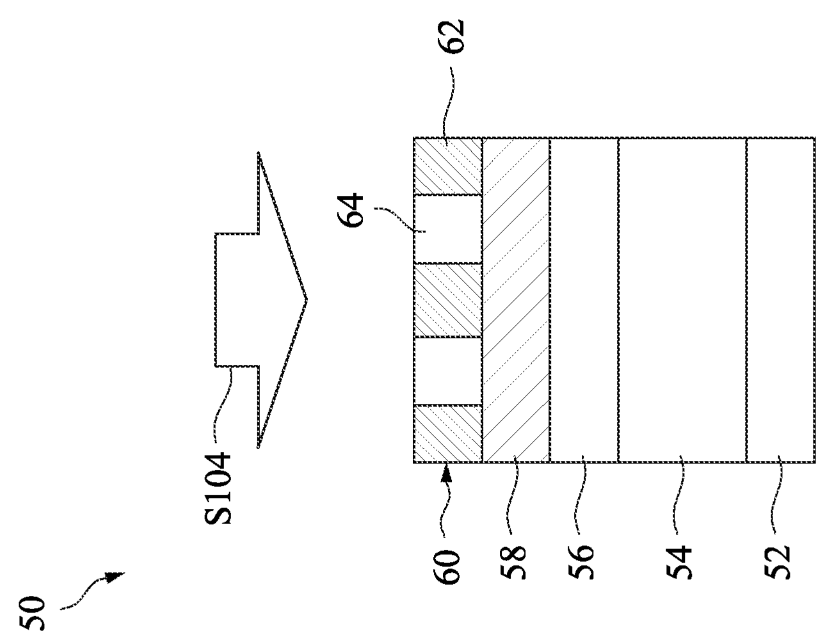

Reference is made to FIG. 9. A post-exposure backing S104 is performed to the photoresist layer 60. The post-exposure baking S104 may be used to assist in the generating, dispersing, and reacting of ions or free radicals generated from the impingement of the radiation upon the photoresist layer 60 during the exposure by the actinic radiation S102 (see FIG. 8). Such assistance helps to create or enhance chemical reactions that generate chemical differences between the exposed region 62 and the unexposed region 64 within the photoresist layer 60. These chemical differences also cause differences in the solubility between the exposed region 62 and the unexposed region 64. In some embodiments, after the post-exposure baking S104, the semiconductor device 50 is cooled.

In the exposed region 62, the metallic photoresist crosslinks or undergoes complexation or condensation, the metallic photoresist become more hydrophobic. As discussed previously, the second hard mask layer 58 includes an increased amount of terminal hydroxyl (—OH) groups. During the post-exposure baking S104, hydroxyl (OH*) radicals can be produced from the terminal hydroxyl (—OH) groups of the second hard mask layer 58, promoting cross-linking of the exposed region 62 of the photoresist layer. Accordingly, a reduced energy dose for extreme ultraviolet (EUV) light can be achieved.

Figure 10:
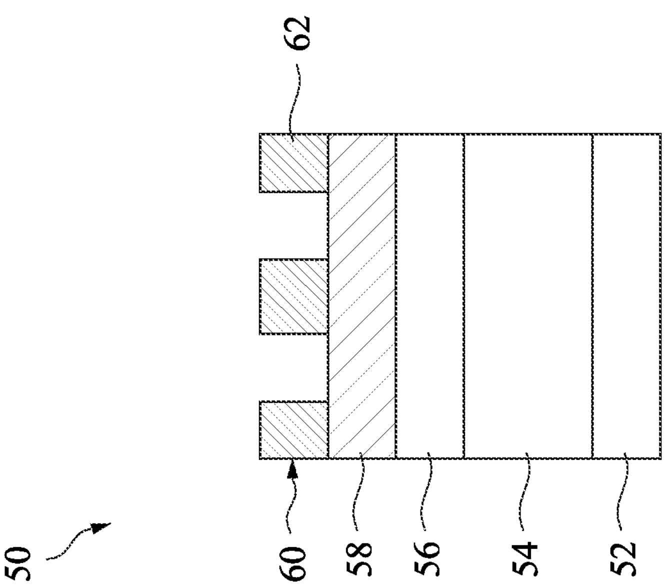

Reference is made to FIG. 10. The photoresist layer 60 is subsequently developed by applying a developer to the photoresist layer 60. In some embodiments, the unexposed region 64 (see FIG. 9) of the photoresist layer 60 is removed by the developer. For example, in some embodiments where the photoresist composition is the negative tone photoresist, the developer may be a basic solution. After the photoresist composition becomes more hydrophobic, the photoresist composition cannot be dissolved by the basic solution, for example, tetramethylammonium hydroxide (TMAH) aqueous solution, such as a 2.38% TMAH. In some other embodiments, the developer may be made of an organic solvent, for example, normal butyl acetate (also known as n-butyl acetate).

Figure 11:
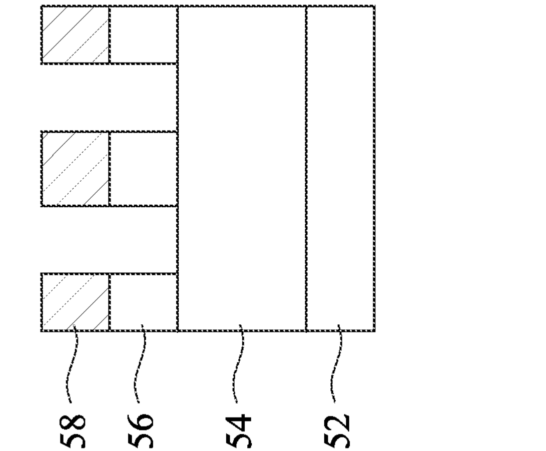

In some embodiments, a pattern of the developed photoresist layer 60 is extended into the second hard mask layer 58, as shown in FIG. 11. That is, the second hard mask layer 58 is etched using the photoresist layer 60 as an etch mask. The pattern is extended into the second hard mask layer 58 by an etching operation, using one or more suitable etchants. A remaining portion of the photoresist layer 60 is at least partially removed during the etching operation in some embodiments. In other embodiments, the remaining photoresist layer 60 is removed after etching the second hard mask layer 58 using a suitable photoresist stripper solvent or by a photoresist ashing operation.

The first hard mask layer 56 is etched using the second hard mask layer 58 as an etch mask. For example, a pattern of the second hard mask layer 58 is extended into the first hard mask layer 56. The pattern is extended into the first hard mask layer 56 by an etching operation using one or more suitable etchants.

Figure 12:
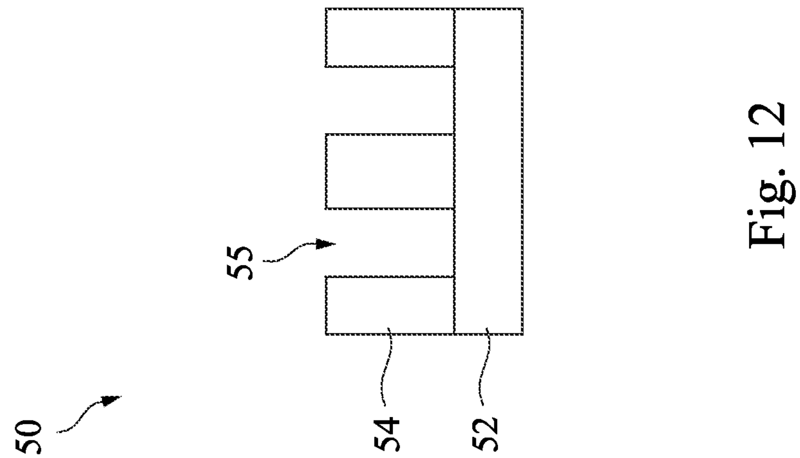

In some embodiments, the target layer 54 is etched using the first hard mask layer 56 as an etch mask, as shown in FIG. 12. Openings 55 are formed in the target layer. For example, a pattern of the first hard mask layer 56 is extended into the target layer 54. The pattern is extended into the target layer 54 by an etching operation, using one or more suitable etchants. A remaining portion of the first hard mask layer 56 and a remaining portion of the second hard mask layer 58 are at least partially removed during the etching operation in some embodiments. In other embodiments, the remaining portions of the first hard mask layer 56 and the second hard mask layer 58 are removed after etching the target layer 54 using a suitable ashing operation.

Figure 14:
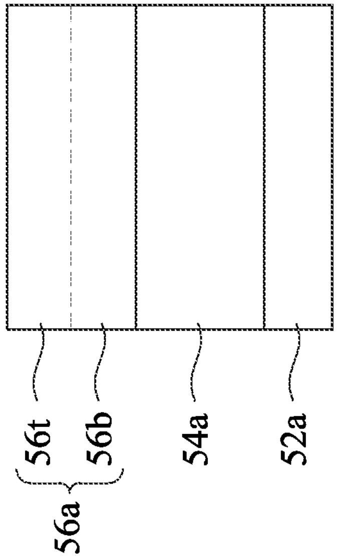
FIGS. 13 to 20 are cross-sectional views of intermediate stages in the formation of features in a target layer of a semiconductor device in accordance with some embodiments.
Figure 13:
Figure 13:
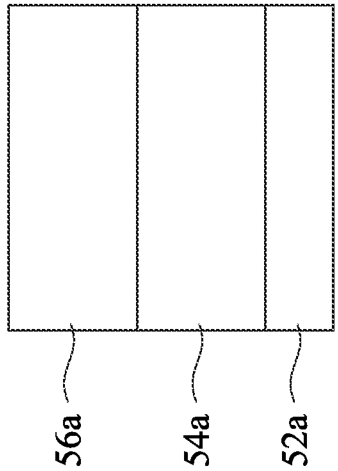

FIGS. 13 to 20 are cross-sectional views of intermediate stages in the formation of features in a target layer 54*a* of a semiconductor device 50*a* in accordance with some embodiments. Reference is made to FIG. 13. A first hard mask layer 56*a* and a target layer 54*a* are formed over a substrate 52*a*. The first hard mask layer 56*a*, the target layer 54*a* and the substrate 52*a* are similar to the first hard mask layer 56, the target layer 54 and the substrate 52 as discussed previously with regard to FIGS. 3 and 4A in terms of composition and formation method thereof, and thus the description thereof is omitted herein. Reference is then made to FIG. 14. In some embodiments, a post-treatment is performed to the as-deposited first hard mask layer 56*a* to increase an amount of terminal hydroxyl (—OH) groups of the first hard mask layer 56*a*, forming a treated region 56*t*. That is, after the post-treatment, the first hard mask layer 56*a* includes the treated region 56*t* and an untreated region 56*b* under the treated region 56*t*. The treated region 56*t* is at a top of the first hard mask layer 56*a*, and the untreated region is at a bottom of the first hard mask layer 56*a*. The post-treatment is similar to the post-treatment S104 as discussed previously with regard to FIG. 6A. For example, the post-treatment is performed using ozone gas, hydrogen peroxide ($H_2O_2$), $H_2O$ rinse, the like, or a combination thereof.

Figure 15:
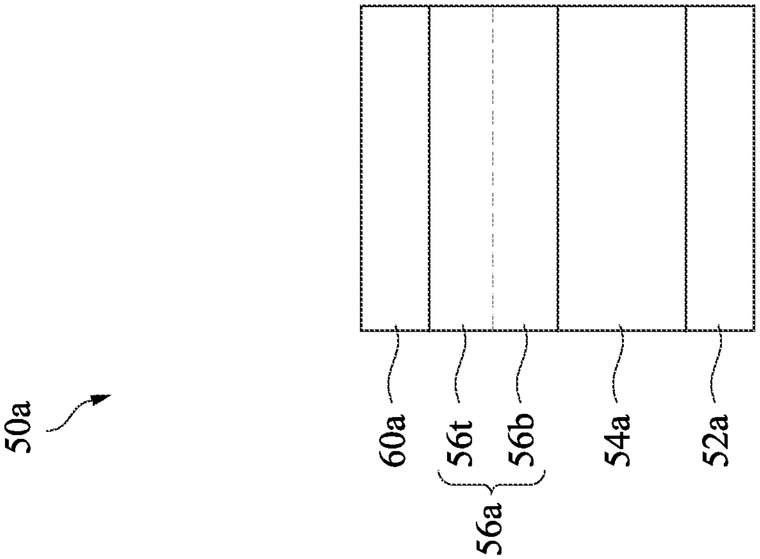

Reference is made to FIG. 15. In some embodiments, a photoresist layer 60*a* is formed on the first hard mask layer 56*a*. The photoresist layer 60*a* is similar to the photoresist layer 60 as discussed previously with regard to FIG. 7 in terms of composition and formation method thereof, and thus the description thereof is omitted herein. The photoresist layer 60*a* is in contact with the treated region 56*t* of the first hard mask layer 56*a* in some embodiments.

Figure 16:
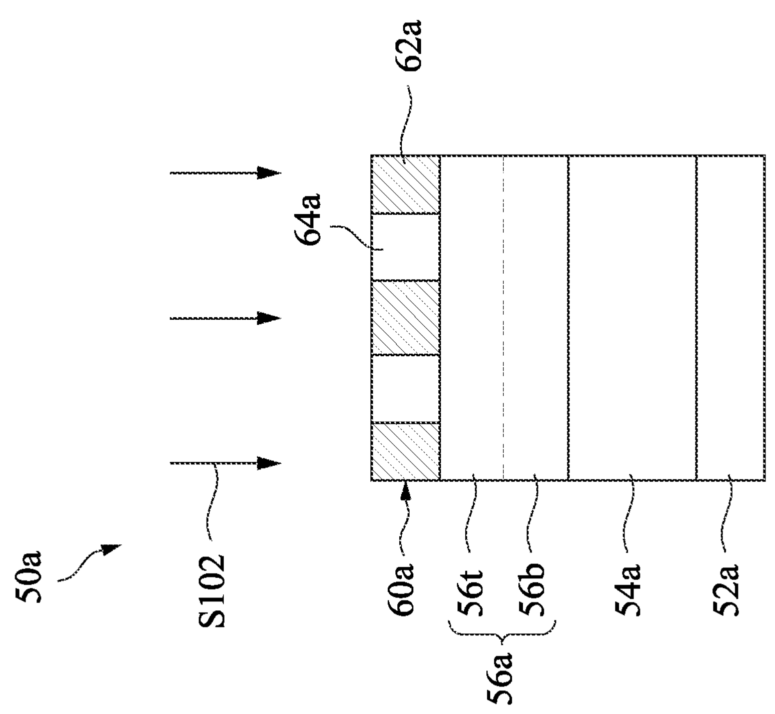

Reference is made to FIG. 16. After forming the photoresist layer 60*a*, the photoresist layer 60*a* is exposed to an actinic radiation S102. For example, the photoresist layer 60*a* has an exposed region 62*a* and an unexposed region 64*a*, as discussed previously with regard to FIG. 8.

Figure 17:
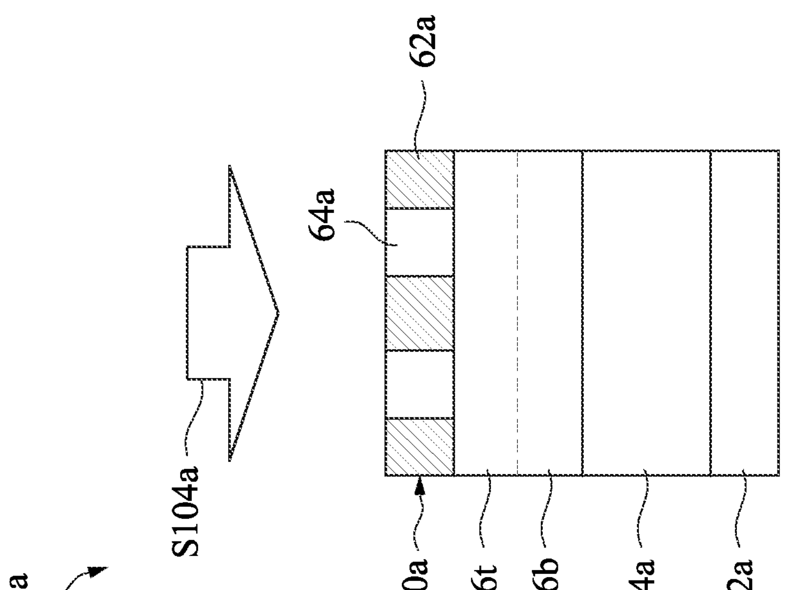

Reference is made to FIG. 17. A post-exposure backing S104*a* is performed to the photoresist layer 60*a*, as discussed previously with regard to FIG. 9. In the exposed region 62*a*, the metallic photoresist crosslinks or undergoes complexation or condensation, the metallic photoresist become more hydrophobic. As discussed previously, the treated region 56*t* of the first hard mask layer 56*a* includes an increased amount of terminal hydroxyl (—OH) groups. During the post-exposure baking S104*a*, hydroxyl (OH*) radicals can be produced from the terminal hydroxyl (—OH) groups of the treated region 56*t* of the first hard mask layer 56*a*, promoting crosslinking of the exposed region 62*a* of the photoresist layer 60*a*.

Figure 18:
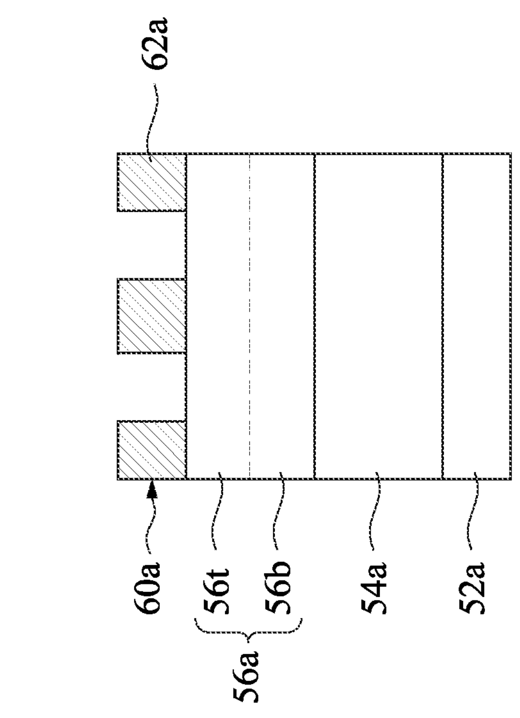

Reference is made to FIG. 18. The photoresist layer 60*a* is subsequently developed by applying a developer to the photoresist layer 60*a*, as discussed previously with regard to FIG. 10.

Figures 19, 20:
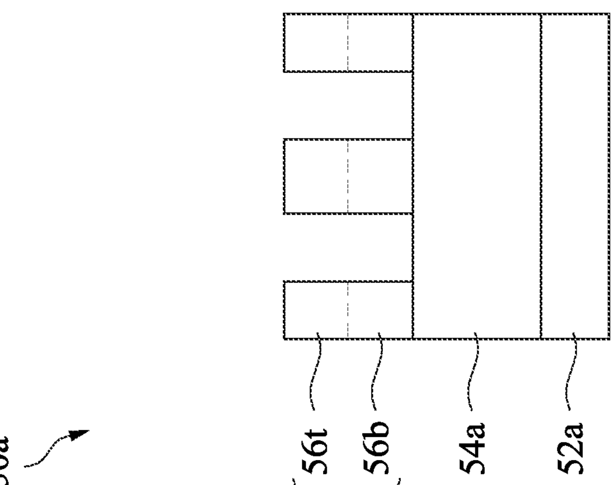

Reference is made to FIG. 19. The first hard mask layer 56*a* is etched using the photoresist layer 60*a* as an etch mask. A remaining portion of the photoresist layer 60*a* is at least partially removed during the etching operation in some embodiments. In other embodiments, the remaining portion of the photoresist layer 60*a* is removed after etching the first hard mask layer 56*a* using a suitable ashing operation.

Reference is made to FIG. 20. In some embodiments, the target layer 54*a* is etched using the first hard mask layer 56*a* as an etch mask. A remaining portion of the first hard mask layer 56*a* is at least partially removed during the etching operation in some embodiments. In other embodiments, the remaining portion of the first hard mask layer 56*a* is removed after etching the first hard mask layer 56*a* using a suitable ashing operation.

Figure 21:
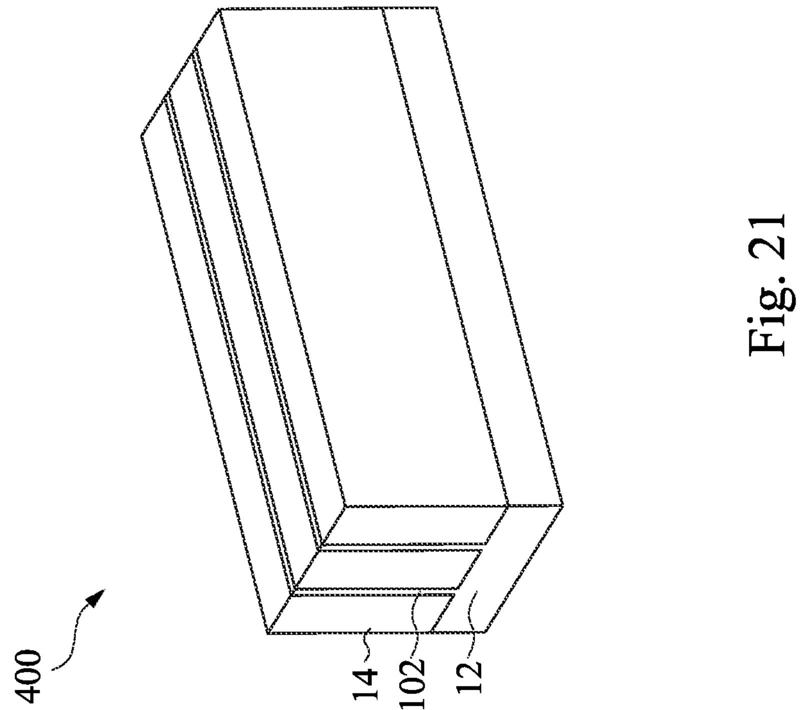
FIGS. 21, 22, and 23A illustrate perspective views of additional fabrication processes in the formation of a semiconductor device on a substrate in accordance with some embodiments of the present disclosure.
Figure 22:
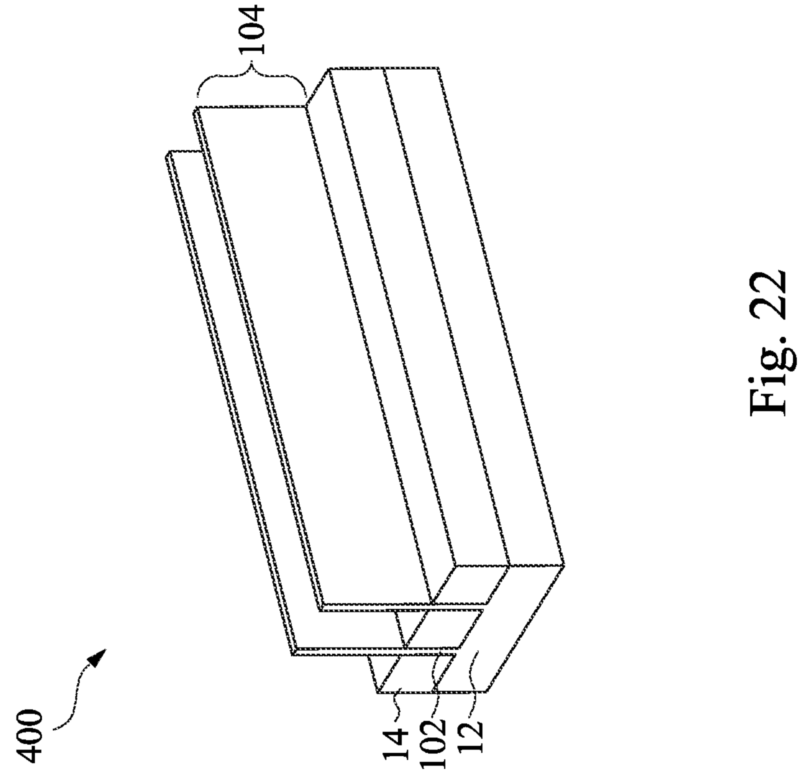
Figure 23A:
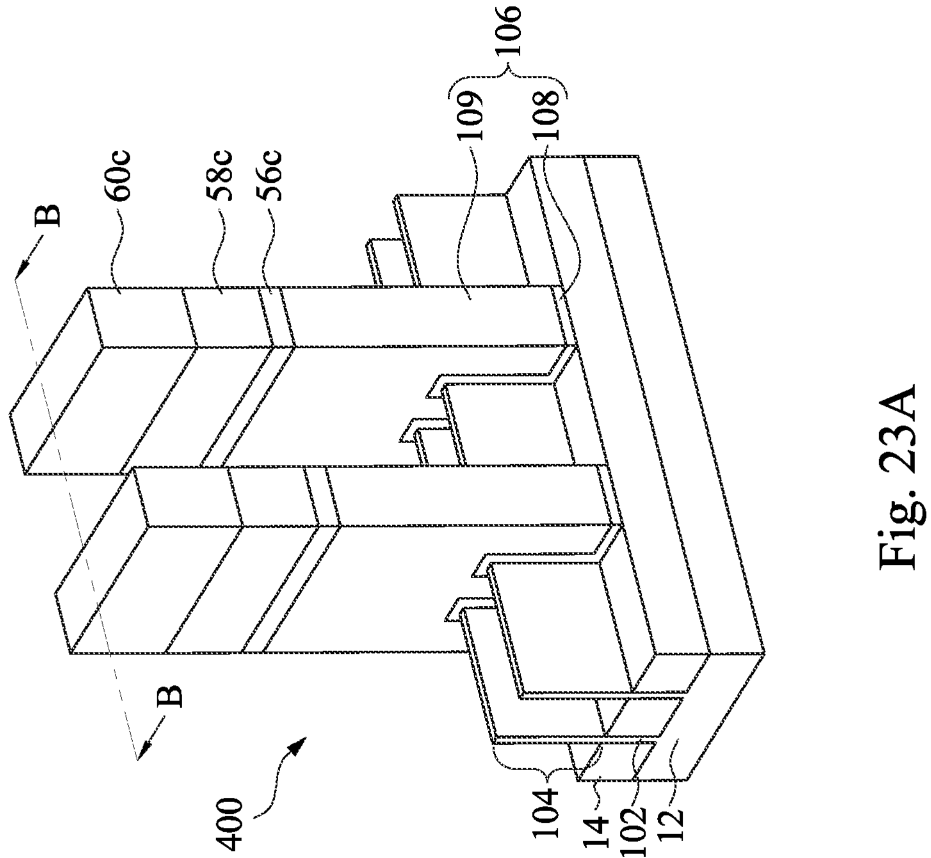

FIGS. 21, 22, and 23A illustrate perspective views of additional fabrication processes in the formation of a semiconductor device 400 on a substrate 12 in accordance with some embodiments of the present disclosure. FIGS. 23B, 24, 25 and 26 illustrate cross-sectional views of additional fabrication processes in the formation of a semiconductor device 400 using a substrate 12 in accordance with some embodiments of the present disclosure. Reference is made to FIG. 21. FIG. 21 illustrates a perspective view of an initial structure. The initial structure includes the substrate 12. The substrate 12 is similar to the substrate 52 as discussed previously with regard to FIG. 3 in terms of composition, and thus the description thereof is omitted herein. Isolation regions such as shallow trench isolation (STI) regions 14 may be formed to extend into the substrate 12. The portions of the substrate 12 between neighboring STI regions 14 are referred to as semiconductor strips 102. In some embodiments, the semiconductor strips 102 can be formed by a plurality of steps including forming a first hard mask layer over the substrate 12, forming a second hard mask layer over the first hard mask layer, forming a photoresist layer over the second hard mask layer, patterning the photoresist layer, patterning the second hard mask layer and the first hard mask layer using the patterned photoresist layer as an etch mask, and patterning the substrate 12 using the patterned second hard mask layer and the patterned first hard mask layer as an etch mask, as discussed previously with regard to FIGS. 4A-12. Since in the step of patterning the photoresist layer, the second hard mask layer with increased terminal hydroxyl (—OH) groups and/or terminal $CH_3$ groups can facilitate crosslinking of the photoresist layer, a reduced energy dose for extreme ultraviolet (EUV) light can be achieved.

In some other embodiments, the semiconductor strips 102 can be formed by a plurality of steps including forming a first hard mask layer over the substrate 12, performing a post-treatment to the first hard mask layer to form a treated region at a top of the photoresist layer, forming a photoresist layer over the first hard mask layer, patterning the photoresist layer, patterning the first hard mask layer using the patterned photoresist layer as an etch mask, and patterning the substrate 12 using the patterned first hard mask layer as an etch mask, as discussed previously with regard to FIGS. 13-20. Since in the step of patterning the photoresist layer, the treated region of the first hard mask layer with increased terminal hydroxyl (—OH) groups can facilitate crosslinking of the photoresist layer, a reduced energy dose for extreme ultraviolet (EUV) light can be achieved.

The STI regions 14 may include a liner oxide (not shown). The liner oxide may be formed of a thermal oxide formed through a thermal oxidation of a surface layer of the substrate 12. The liner oxide may also be a deposited silicon oxide layer formed using, for example, ALD, High-Density Plasma Chemical Vapor Deposition (HDPCVD), or CVD. The STI regions 14 may also include a dielectric material over the liner oxide, and the dielectric material may be formed using flowable chemical vapor deposition (FCVD), spin-on coating, or the like.

Referring to FIG. 22, the STI regions 14 are recessed, so that the top portions of semiconductor strips 102 protrude higher than the top surfaces of the neighboring STI regions 14 to form protruding fins 104. The etching may be performed using a dry etching process or a wet etching process.

The materials of fins 104 may also be replaced with materials different from that of substrate 12. For example, if the fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the fins 104 serve for p-type transistors, the protruding fins 104 may be formed of Si, SiGe, SiGeB, Ge, or a III-V compound semiconductor such as InSb, GaSb, InGaSb, or the like.

Figure 23B:
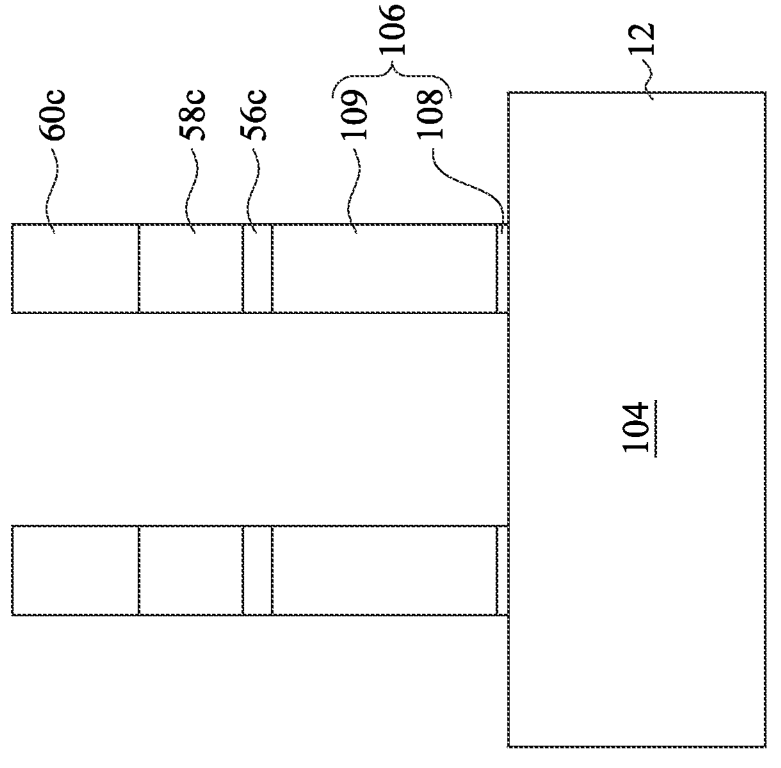
FIGS. 23B, 24, 25 and 26 illustrate cross-sectional views of additional fabrication processes in the formation of a semiconductor device using a substrate in accordance with some embodiments of the present disclosure.

Referring to FIGS. 23A and 23B, dummy gate structures 106 are formed on the top surfaces and the sidewalls of fins 104. FIG. 23B illustrates a cross-sectional view obtained from a vertical plane containing line B-B in FIG. 23A. Formation of the dummy gate structures 106 includes depositing in sequence a blankly formed gate dielectric layer and a blankly formed dummy gate electrode layer across the fins 104, followed by patterning the blanket formed gate dielectric layer and the blankly formed dummy gate electrode layer. As a result of the patterning, the dummy gate structure 106 includes a dummy gate dielectric layer 108 and a dummy gate electrode 109 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 109 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of fins 104. The dummy gate structures 106 may have lengthwise directions perpendicular to the lengthwise directions of the respective fins 104.

In some embodiments, the blankly formed dummy gate electrode layer and the blankly formed gate dielectric layer may be patterned using a stack including a first hard mask layer 56*c*, a second hard mask layer 58*c* and a photoresist layer 60*c*. The first hard mask layer 56*c*, the second hard mask layer 58*c* and the photoresist layer 60*c* are similar to the first hard mask layer 56, the second hard mask layer 58 and the photoresist layer 60 as discussed previously with regard to FIGS. 4A-10 in terms of composition and formation method. The above discussion of the first hard mask layer 56, the second hard mask layer 58 and the photoresist layer 60 applies to the first hard mask layer 56*c*, the second hard mask layer 58*c* and the photoresist layer 60*c* in FIGS. 23A-23B, unless mentioned otherwise. As discussed previously, since in the step of patterning the photoresist layer 60*c*, the second hard mask layer 58*c* with increased terminal hydroxyl (—OH) groups and/or terminal $CH_3$ groups can facilitate crosslinking of the photoresist layer 60*c*, a reduced energy dose for extreme ultraviolet (EUV) light can be achieved.

Figure 24:
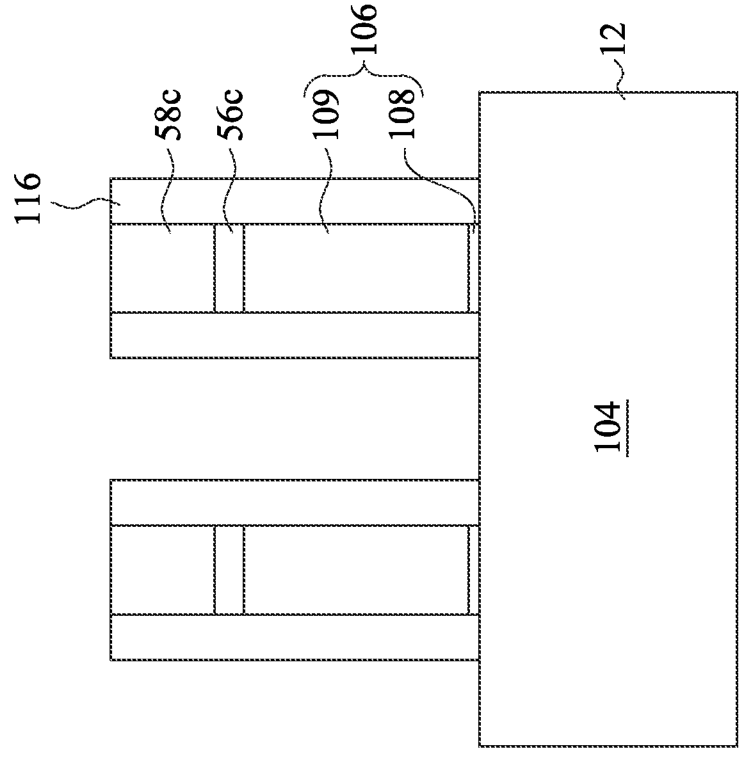

Next, as illustrated in FIG. 24, gate spacers 116 are formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material.

The low-k dielectric material has a dielectric constant (k value) of lower than about 3.5. Suitable materials for the low-k dielectric material may include silicon oxide, silicon nitride, silicon oxynitride, or the like. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 25:
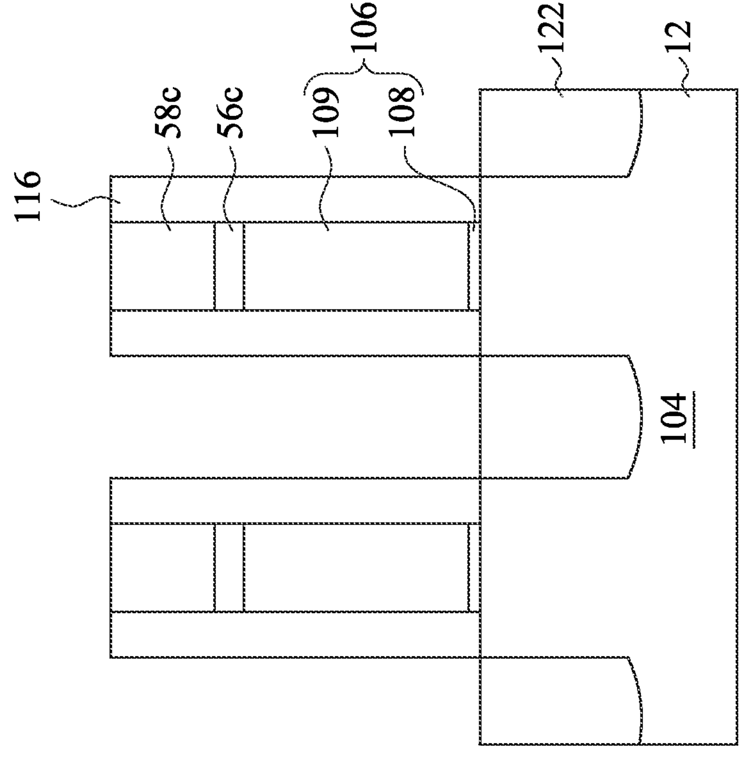

In FIG. 25, after formation of the gate spacers 116 is completed, source/drain epitaxial structures 122 are formed on source/drain regions of the protruding fins 104 that are not covered by the dummy gate structures 106 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fins 104 can be recessed using suitable selective etching processing that attacks the fins 104, but hardly attacks the gate spacers 116 and the top masks 114 of the dummy gate structures 106. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 116 and the top masks 114 of the dummy gate structures 106. In some other embodiments, recessing the protruding fins 104 may be performed by a wet chemical etch which etches the fins 104 at a faster etch rate than it etches the gate spacers 116 and the top masks 114 of the dummy gate structures 106. In some other embodiments, recessing the protruding fins 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including p-type dopants, such as boron or $BF_2$, n-type dopants, such as phosphorus or arsenic, and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 26:
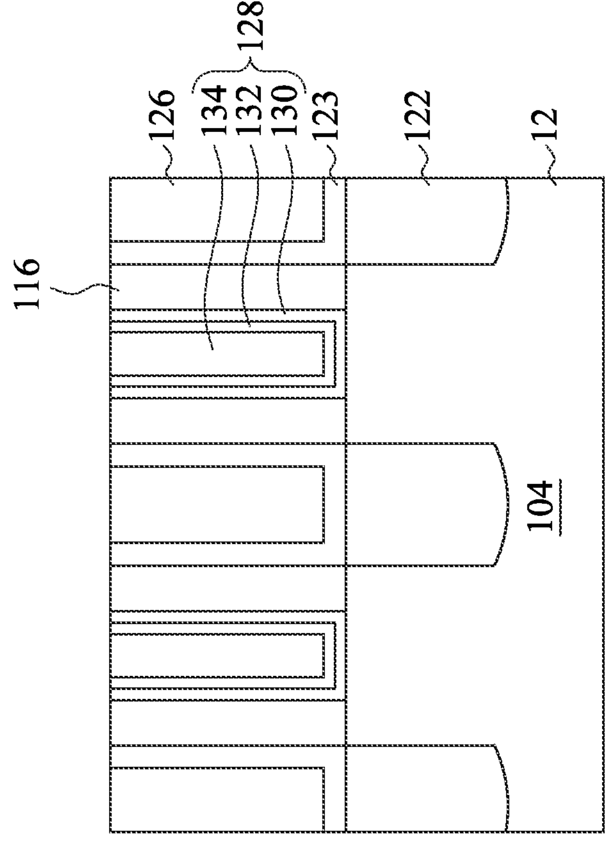

Next, in FIG. 26, a contact etch stop layer (CESL) 123 and an interlayer dielectric (ILD) layer 126 are formed on the substrate 12 in sequence. In some examples, the CESL 123 includes a silicon nitride layer, silicon oxide layer, a silicon oxynitride layer, and/or other suitable materials having a different etch selectivity than the ILD layer 126. The CESL 123 may be formed by PECVD process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 123. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 123. For example, a planarization process includes a chemical mechanical planarization (CMP) process which removes portions of the ILD layer 126 and the CESL 123 overlying the dummy gate structures 106. In some embodiments, the CMP process also removes bottom masks 112 and top masks 114 (as shown in FIG. 25) and exposes the dummy gate electrodes 109.

An etching process is performed to remove the dummy gate electrode 109 and the dummy gate dielectric layer 108, resulting in gate trenches between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate spacers 116 and/or the ILD layer 126).

Thereafter, replacement gate structures 128 are respectively formed in the gate trenches. The gate structures 128 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 128 forms the gate associated with the three-sides of the channel region provided by the fin 104. Stated another way, each of the gate structures 128 wraps around the fin 104 on three sides.

In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trenches. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 132 and/or the fill metal 134 used within high-k/metal gate structures 128 may include a metal, metal alloy, or metal silicide. Formation of the high-k/metal gate structures 128 may include multiple deposition processes to form various gate materials, one or more liner layers, and one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 400 includes other layers or features not specifically illustrated. In some embodiments, back end of line (BEOL) processes are performed on the semiconductor device 400. In some embodiments, the semiconductor device 400 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that a hard mask layer with increased terminal hydroxyl (—OH) groups and/or terminal $CH_3$ groups to facilitate crosslinking of an overlying negative photoresist.

In some embodiments, a method includes following steps. A target layer is formed over a substrate. A first hard mask layer is formed over the target layer by a plasma generated using a first radio frequency generator and a second radio frequency generator. The first radio frequency generator and the second radio frequency generator have different powers. A second hard mask layer is formed over the first hard mask layer by a plasma generated using the first radio frequency generator without using the second radio frequency generator. A photoresist layer is formed over the second hard mask layer. The photoresist layer is exposed. The photoresist layer is developed. The first hard mask layer and the second hard mask layer are patterned using the photoresist layer as an etch mask. The target layer is patterned using the first hard mask layer and the second hard mask layer as an etch mask. In some embodiments, the power of the first radio frequency generator is higher than the power of the second radio frequency generator. In some embodiments, the method further includes treating the second hard mask layer using an oxygen-containing chemical. In some embodiments, the method further includes treating the second hard mask layer using ozone gas, hydrogen peroxide ($H_2O_2$), or $H_2O$. In some embodiments, forming the second hard mask layer further comprises introducing a hydrocarbon-containing precursor and a hydrogen gas to the first hard mask layer. In some embodiments, the hydrocarbon-containing precursor is $C_2H_2$. In some embodiments, the first hard mask layer is formed at a first temperature, and the second hard mask layer is formed at a second temperature lower than the first temperature. In some embodiments, the second hard mask layer has an amount of terminal $CH_3$ groups being more than an amount of terminal $CH_3$ groups of the first hard mask layer. In some embodiments, the second hard mask layer has an amount of terminal carbon-carbon double bonds being less than an amount of terminal carbon-carbon double bonds of the first hard mask layer. In some embodiments, the photoresist layer is in contact with the second hard mask layer.

In some embodiments, a method includes the following steps. A target layer is formed on a substrate. A hard mask layer is deposited on the target layer. A top region of the hard mask layer is treated using an oxygen-containing chemical. A photoresist layer is formed over the hard mask layer. The photoresist layer is patterned. The hard mask layer is etched using the photoresist layer as an etch mask. The target layer is etched using the hard mask layer as an etch mask. In some embodiments, the photoresist layer is in contact with the top region of the hard mask layer. In some embodiments, the oxygen-containing chemical comprises ozone gas, hydrogen peroxide ($H_2O_2$), or $H_2O$. In some embodiments, the hard mask layer is an amorphous carbon layer. In some embodiments, depositing the hard mask layer on the target layer is performed by a plasma-enhanced chemical vapor deposition by generating a plasma in a chamber using a high frequency radio frequency generator.

A method includes the following steps. A multi-layer film stack is formed over a substrate. A first plasma deposition is performed to form a first hard mask layer over the multi-layer film stack. A second plasma deposition is performed to form a second hard mask layer over the first hard mask layer, wherein the second hard mask layer and the first hard mask layer have different amounts of terminal $CH_3$ groups. A photoresist layer is formed over the second hard mask layer. The photoresist layer is patterned. After the photoresist layer is patterned, the second hard mask layer and the first hard mask layer are patterned. The multi-layer film stack is etched. In some embodiments, the first hard mask layer is an amorphous carbon layer. In some embodiments, the second hard mask layer is an amorphous carbon layer. In some embodiments, the first plasma deposition is performed by a plasma generated using a first radio frequency generator and a second radio frequency generator, and the first radio frequency generator and the second radio frequency generator have different powers. In some embodiments, the second plasma deposition is performed by a plasma generated using the first radio frequency generator without using the second radio frequency generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a target layer over a substrate;

forming a first hard mask layer over the target layer by a plasma generated using a first radio frequency generator and a second radio frequency generator, the first radio frequency generator and the second radio frequency generator having different powers;

forming a second hard mask layer over the first hard mask layer by a plasma generated using the first radio frequency generator without using the second radio frequency generator;

forming a photoresist layer over the second hard mask layer;

exposing the photoresist layer;

developing the photoresist layer;

patterning the first hard mask layer and the second hard mask layer using the photoresist layer as an etch mask; and patterning the target layer using the first hard mask layer and the second hard mask layer as an etch mask.

2. The method of claim 1, wherein the power of the first radio frequency generator is higher than the power of the second radio frequency generator.

3. The method of claim 1, further comprising:

treating the second hard mask layer using an oxygen-containing chemical.

4. The method of claim 1, further comprising:

treating the second hard mask layer using ozone gas, hydrogen peroxide ($H_2O_2$), or $H_2O$.

5. The method of claim 1, wherein forming the second hard mask layer further comprises:

introducing a hydrocarbon-containing precursor and a hydrogen gas to the first hard mask layer.

6. The method of claim 5, wherein the hydrocarbon-containing precursor is $C_2H_2$.

7. The method of claim 1, wherein the first hard mask layer is formed at a first temperature, and the second hard mask layer is formed at a second temperature lower than the first temperature.

8. The method of claim 1, wherein the second hard mask layer has an amount of terminal $CH_3$ groups being more than an amount of terminal $CH_3$ groups of the first hard mask layer.

9. The method of claim 1, wherein the second hard mask layer has an amount of terminal carbon-carbon double bonds being less than an amount of terminal carbon-carbon double bonds of the first hard mask layer.

10. The method of claim 1, wherein the photoresist layer is in contact with the second hard mask layer.

11. A method, comprising:

forming a target layer over a substrate;

forming a first carbon-based hard mask layer over the target layer by a plasma generated using a first radio frequency generator and a second radio frequency generator, the first radio frequency generator and the second radio frequency generator having different powers;

forming a second carbon-based hard mask layer over the first carbon-based hard mask layer by a plasma generated using the first radio frequency generator without using the second radio frequency generator;

forming a photoresist layer over the second carbon-based hard mask layer;

exposing the photoresist layer;

developing the photoresist layer;

patterning the first carbon-based hard mask layer and the second carbon-based hard mask layer using the photoresist layer as an etch mask; and patterning the target layer using the first carbon-based hard mask layer and the second carbon-based hard mask layer as an etch mask.

12. The method of claim 11, wherein the photoresist layer is in contact with a top region of the second carbon-based hard mask layer.

13. The method of claim 11, further comprising:

treating a top region of the second carbon-based hard mask layer using an oxygen-containing chemical.

14. The method of claim 13, wherein the oxygen-containing chemical comprises ozone gas, hydrogen peroxide ($H_2O_2$), or $H_2O$.

15. The method of claim 11, wherein the first carbon-based hard mask layer is an amorphous carbon layer.

16. A method, comprising:

forming a target layer over a substrate;

depositing a first hard mask layer over the target layer by a plasma deposition method using a plasma generated using a first radio frequency generator and a second radio frequency generator, the first radio frequency generator and the second radio frequency generator having different powers;

forming a second hard mask layer over the first hard mask layer by a plasma generated using the first radio frequency generator without using the second radio frequency generator;

forming a photoresist layer over the second hard mask layer;

exposing the photoresist layer;

developing the photoresist layer;

patterning the first hard mask layer and the second hard mask layer using the photoresist layer as an etch mask; and etching the target layer using the first hard mask layer and the second hard mask layer as an etch mask.

17. The method of claim 16, wherein the first hard mask layer is an amorphous carbon layer.

18. The method of claim 16, wherein the second hard mask layer is an amorphous carbon layer.

19. The method of claim 16, wherein forming the second hard mask layer over the first hard mask layer comprises:

forming the second hard mask layer at a temperature different from a temperature of depositing the first hard mask layer over the target layer.

20. The method of claim 16, wherein forming the second hard mask layer over the first hard mask layer comprises:

forming the second hard mask layer at a temperature lower than a temperature of depositing the first hard mask layer over the target layer.

* * * * *